United States Patent [19]

Blake et al.

[11] Patent Number: 4,912,675

[45] Date of Patent: Mar. 27, 1990

[54] SINGLE EVENT UPSET HARDENED MEMORY CELL

[75] Inventors: Terence G. W. Blake, Dallas; Theodore W. Houston, Richardson, both of Tex.

[73] Assignee: Texas Instruments, Incorporated, Dallas, Tex.

[21] Appl. No.: 241,681

[22] Filed: Sep. 7, 1988

[51] Int. Cl.[4] .............................................. G11C 11/40
[52] U.S. Cl. .................................................. 365/154
[58] Field of Search .................... 365/154, 156, 177

[56] References Cited

U.S. PATENT DOCUMENTS 4,725,981  2/1988  Rutledge ............................. 365/154
4,797,804  1/1989  Rockett, Jr. ......................... 365/154

OTHER PUBLICATIONS

"CMOS RAM Cosmic Ray-Induced Error Rate Analysis", J. C. Pickel, et al. *IEEE Trans. on Nuclear Science*, vol. NS-28, pp. 3962-3967 (1981).
"DMSP Dosimetry Data: A Space Measurement and Mapping of Upset Causing Phenomena", E. G. Gussenhower, et al., *IEEE Trans. Nuclear Science*, vol. NS-34, pp. 1251-1255 (1987).
"An SEU Tolerant Memory Cell Derived from Fundamental STudies of SEU Mechanisms in SRAM", H. T. Weaver, et al., *IEEE Trans. Nuclear Science*, vol. NS-34, pp. 1281-1286 (1987).
"Alpha Particle Induced Soft Errors in Dynamic Memories", T. C. May, et al., *IEEE Trans. Electronic Devices*, vol. ED-26, p. 2 (1979).

*Primary Examiner*—James W. Moffitt
*Attorney, Agent, or Firm*—Stanton C. Braden; Rodney M. Anderson; Melvin Sharp

[57] ABSTRACT

Single event upset hardening is provided in a static random access memory cell, including cross-coupled inverters, by the restoration of voltages at selected nodes within the cell by a pair of transistors connected to the cross-coupling between inverters.

13 Claims, 7 Drawing Sheets

SINGLE EVENT UPSET HARDENED MEMORY CELL

This invention was made with Government support under contract no. AFWL/CSC S-408 awarded by the United States Air Force. The government was certain rights in this invention.

FIELD OF THE INVENTION

This invention is in the field of integrated circuits and is specifically directed to static random access memories.

BACKGROUND OF THE INVENTION

Static memory cells in certain environments in which radiation is present such as communication satellite orbital space are, or will likely be particularly susceptible to soft errors or single event upsets (SEUs). See E. G. Gussenhower, K. A. Lynch and D. H. Brenteger, "DMSP Dosimetry Data: A Space Measurement and Mapping of Upset Causing Phenomena", IEEE Trans. Nuclear Science NS-34, pp. 1251–1255 (1987) and H. T. Weaver, et al., "An SEU Tolerant Memory Cell Derived from Fundamental Studies of SEU Mechanisms in SRAM", IEEE Trans. Nuclear Science, NS-34, pp. 1281–1286 (1987). A soft error or single event upset (SEU) typically is caused by electron-hole pairs created by, and along the path of, a single energetic particle as it passes through an integrated circuit, such as a memory. Should the energetic particle generate the critical charge in the critical volume of a memory cell, then the logic state of the memory is upset. This critical charge, by definition, is the minimum amount of electrical charge required to change the logic state of the memory cell. The critical charge may also enter the memory through direct ionization from cosmic rays. See T. C. May and M. H. Woods, "Alpha Particle Induced Soft Errors in Dynamic Memories", IEEE Trans. Electronic Devices, ED-26, p. 2 (1979) and J. C. Pickel, J. T. Blaudfood, Jr., "CMOS RAM Cosmic Ray - Induced Error Rate Analysis", IEEE Trans. on Nuclear Science, Vol. NS-28, pp. 3962–3967 (1981). Alternatively, the critical charge may result from alpha particles (helium nuclei). One example of SEU can be seen in FIG. 1a which illustrates a cross-sectional view of a CMOS inverter. When alpha particle p strikes bulk semiconductor material in p-channel MOS transistor Pch, it generates electron-hole pairs as shown by the respective minus and plus marks. Assuming that n-channel transistor Nch is on and that p-channel transistor Pch is off, the holes (indicated by plus signs) which collect (see arrows toward drain D) at drain D can change the voltage at output OUT from a logic low to a logic high. The electrons as indicated by the minus signs will diffuse toward circuit supply voltage Vcc. A charge generating particle hit on transistor Nch has the opposite effect with positive charge drifting towards ground and negative charges collecting at output OUT, thus possibly changing the logic state of the inverter.

Further background follows with reference to FIG. 1b which illustrates a schematic drawing of a conventional CMOS (complementary metal oxide semiconductor) static memory cell, typically used in a static random access memory (SRAM). (Note that the word metal used in the phrase metal oxide semiconductor is interpreted in semiconductor and other related arts as encompassing polycrystalline material. Memory cell 2 is constructed according to well known methods of cross-coupled inverter realization and thus CMOS inverters are used in memory cell 2. A first CMOS inverter 4 in memory cell 2 comprises p-channel transistor 6 and n-channel transistor 8 having their source-to-drain paths connected in series between Vcc and ground, and having their gates tied together. The second CMOS inverter 5 in memory cell 2 is similarly constructed, with p-channel transistor 10 and n-channel transistor 12 having their source-to-drain paths connected in series between Vcc and ground and their gates also common. The cross-coupling is accomplished by the gates of transistors 6 and 8 being connected to the drains of transistors 10 and 12 (node S1 of FIG. 1b), and by the gates of transistors 10 and 12 being connected to the drains of transistors 6 and 8 (node S2 of FIG. 1b). The above described arrangement and structure of inverter 4 coupled to inverter 5 are commonly referred to as cross-coupled inverters, while the lines connecting gates and drains are each referred to as a cross-coupling line. N-channel pass transistor 14 has its source-to drain path connected between node S2 and a first bit line BL, and has its gate connected to word line WL. N-channel pass transistor 16 similarly has its source-to-drain path connected between node S1 and a second bit line BL_, and has its gate also connected to word line WL. Pass transistors 14, 16 when enabled, allow data to pass into and out of memory cell 2 from bit lines BL and BL_ respectively. Bit lines BL and BL_ carry data into and out of memory cell 2. Pass transistors 14, 16 are enabled by word line WL which is a function of the row address in an SRAM. The row address is decoded by a row decoder in the SRAM such that one out of n word lines is enabled, where n is the number of rows of memory cells in the memory which is a function of memory density and architecture.

In operation, the voltages of node S1 and S2 will necessarily be logical complements of one another, due to the cross-coupled nature of CMOS inverters 4,5 within memory cell 2. When word line WL is energized by the row decoder (not shown), according to the row address received at address inputs to an address buffer (not shown) connected to the row decode, pass transistors 14 and. 16 will be turned on, coupling nodes S1 and S2 to bit lines BL_ and BL, respectively. Accordingly, when word line WL is high, the state of memory cell 2 can establish a differential voltage on BL and BL_. Alternatively, peripheral circuitry forcing a voltage on BL and BL_ can alter the state of memory cell 2. The sizes of the transistors shown in FIG. 1b are generally chosen such that when pass transistors 14 and 16 are turned on by word line WL; differentially low voltage at bit line BL with respect to bit line BL_ can force node S2 to a logic low level; and a differentially low voltage at bit line BL_ with respect to bit line BL can force node S1 to a logic low level. However, the sizes of the transistors shown in FIG. 1b are also chosen such that when transistors 14 and 16 are on; a differentially high voltage at bit line BL with respect to bit line BL_ will not force node S2 high; nor will a differentially high voltage at bit line BL_ with respect to bit line BL force node S1 high. Therefore writing into memory cell 2 is accomplished by pulling the desired bit line and thus the desired side of cell 2 at either node S1 or node S2 low, which in turn due to feedback paths in cell 2, causes the opposite side of cell 2 to have a logic high state.

One method for hardening a memory cell against SEU is by reducing the amount of charge generated by a given event. This is accomplished for example, by using a silicon film thinner than the collection depth in bulk material. For instance, a memory cell created on a thin film on an insulator, such as in a SOI (silicon on insulator) device is less susceptible to SEU than one created on bulk semiconductor such as silicon because ionization charge along a path in an insulator is more likely to recombine than be collected compared to ionization charge created in a semiconductor.

Another way to reduce the susceptibility of a memory cell to upset is by increasing the critical charge of the cell. A hardening scheme against SEU in static memory cells based on increasing the critical charge required to produce SEU is illustrated in the schematic drawing of FIG. 2a. As shown, resistors 18 and 20 are included in the cross-coupling lines of inverters 4 and 5 and they increase the RC time constant delay associated with the gate capacitances of transistors 6, 8, 10, and 12. The initial effect of an energetic particle strike in a critical volume is to change the voltage of one node of the memory cell, say node S1. Upset will occur if this change in voltage propagates through the cross coupling of inverters 4 and 5 before the initial voltage of node S1 is restored. The increased RC delay slows the feedback propagation through the cross coupling and allows more time for recovery of the initially affected node. However, this increase in RC propagation delay also slows the write cycle time of cell 2. The write cycle of an SRAM has typically been faster than the read cycle so that some slowing of the write cycle has been acceptable, since the read cycle time was the most critical. However, with scaling of memory cells to small geometries, the speed of the write cycle of SEU hardened cells has become critical. Therefore, this resistive approach to SEU hardening is no longer desirable.

Another hardening scheme against SEU based on increasing the critical charge is to increase the capacitance on the inverter drains, thus decreasing the voltage change on the node for a given amount of collected charge. The effectiveness of the capacitance in increasing the critical charge for SEU is increase by having the capacitance between the drains of the two inverters, which, with the cross coupling, is the same as between the gate and drain of the same inverter, as shown in FIG. 2b. FIG. 2b illustrates the same circuit schematic as FIG. 1b with the exception that capacitor 21 is connected across the drains of inverters S1 and S2. By having the capacitance between the gate and drain of the inverter, the effect of the capacitance is increased by Miller capacitance. Also, with the capacitance from gate to drain, a change in the drain voltage induces a change in the gate voltage such that the restoring current is increased. Increased capacitance on the gate will also increase the RC delay in the feedback path, thus increasing resistance to SEU and also slowing the WRITE; however, so long as the resistance is small, this effect will be minimal.

OBJECTS OF THE INVENTION

It is an object of the invention to provide a new and improved memory cell. It is another object of the invention to provide a new and improved memory cell for use in a static random access memory.

It is still another object of the invention to provide a new and improved memory cell having increased hardness against single event upset.

SUMMARY OF THE INVENTION

The foregoing objects of the invention are accomplished by a memory cell including cross-coupled inverters. A pair of transistors are connected in the cross-coupling of the inverters with the body node of these transistors tie d to selected nodes of the memory cell so as to maintain the functionality of the memory cell (maintain cross- coupling feedback) while increasing the critical charge for SEU relative to a cell without such transistors in the cross-coupling.

One embodiment of the invention includes a selected transistor from the pair, which includes a common gate with the transistors of a first inverter of the cross-coupled inverters. The selected transistor from the pair additionally includes a first drain/source region connected to the common drain of the first inverter and a second drain/source region connected to the common gate of a second inverter of the cross-coupled inverters.

The body of the selected transistor from the pair is connected to the common drain of the first inverter. Alternatively, the body of the selected transistor from the pair is connected to the common gate of the first inverter. Another alternative connects the body of the selected transistor from the pair to the common gate of the second inverter. Still alternatively, thebody of the selected transistor from the pair is connected to both the gate of one inverter and the drain of the other inverter. The contact to the body node results in the body-to-source/drain diode being included in the cross-coupling action. The transistors from the pair in the first embodiment each also include an associated first gated diode structure comprising an n-type semiconductor region proximate to a p-type semiconductor region proximate to a p-type semiconductor region so as to serve as the first source/drain region of a transistor of the pair. When a transistor of the pair is turned off, the associated gated diode structure can provide a feedback path through the cell. Alternatively, for increased cell speed, the transistors from the pair can each further include an associated second structure including a n-type semiconductor region proximate to a p-type semiconductor region so as to serve as the second source/drain region of a transistor of the pair.

DETAILED DESCRIPTION OF THE INVENTION

Figure 1A:
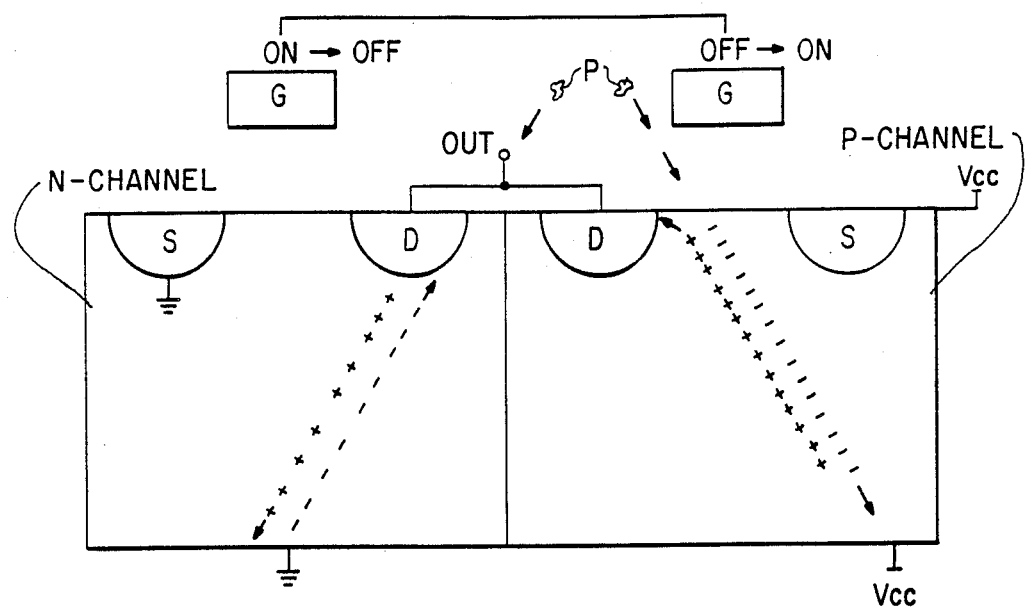
FIG. 1a is a cross-sectional view of a CMOS inverter.
Figure 1B:
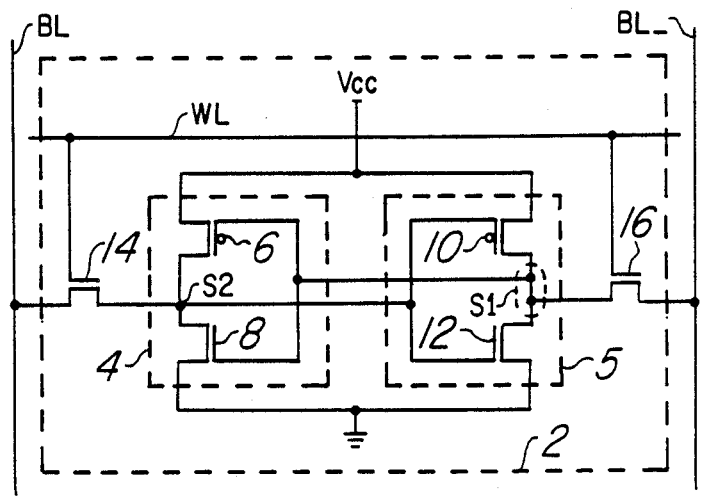
FIG. 1b is a schematic drawing of a conventional CMOS memory cell typically used in an SRAM.
Figure 2A:
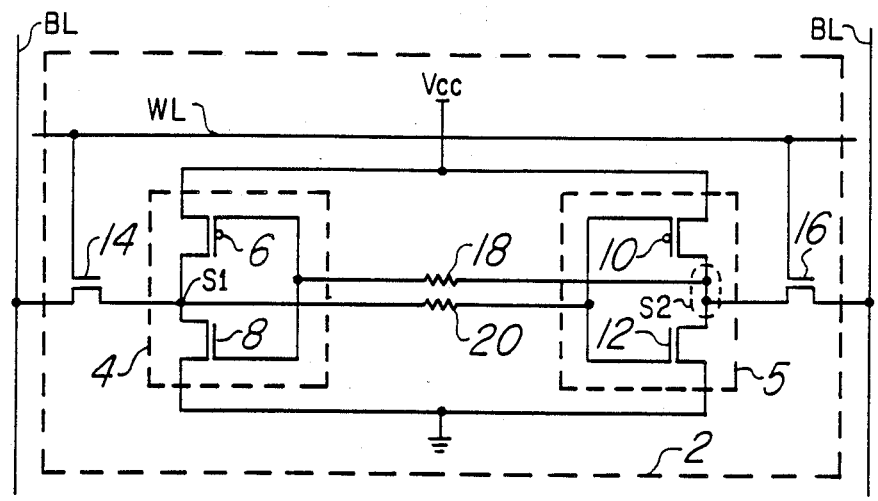
FIG. 2a is a schematic drawing of a prior art SEU hardening scheme based on increasing critical charge.
Figure 2B:
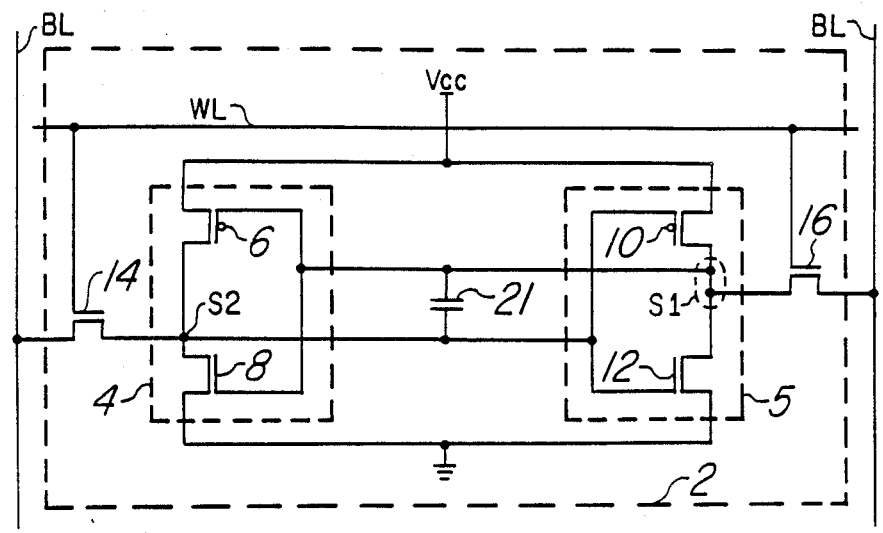
FIG. 2b illustrates a schematic drawing of an inverter in parallel with a capacitor so as to show Miller capacitance.
Figure 3A:
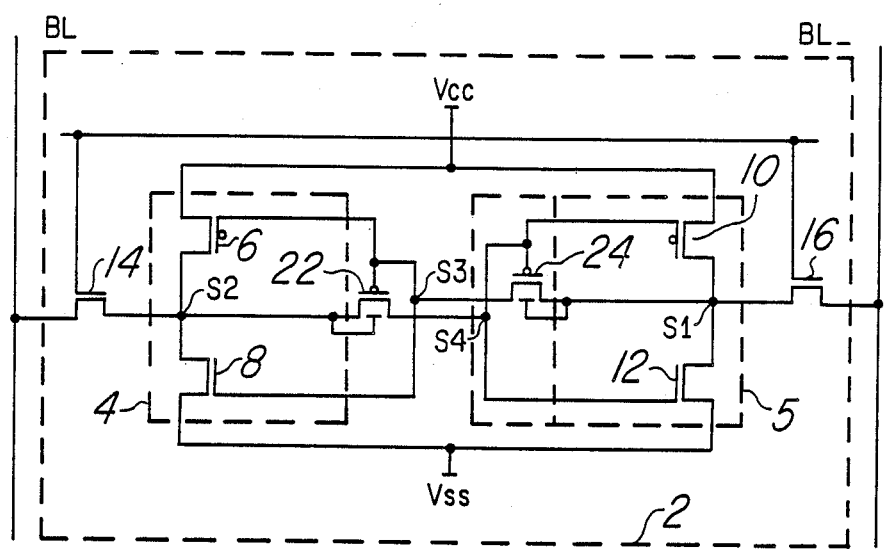
FIG. 3a illustrates a schematic drawing of a first preferred embodiment of the invention.

A schematic drawing of an integrated circuit which includes a first preferred embodiment of invention is illustrated in FIG. 3a. Note that for optimum SEU hardness that this circuit is built on an insulator (although it can be built on bulk semiconductor material) and therefore can be classified as a silicon on insulator (SOI) device. However, if built on bulk, near full benefit can be obtained if the devices in the cross-coupling are isolated from the bulk. FIG. 3a illustrates the same circuit schematic as FIG. 1b with the exception that p-channel transistors 22 and 24 are connected across an associated cross-coupling line joining a gate of one inverter to the drain of another. The body of transistor 22 is tied to node S2 while the body of transistor 24 is tied to node S1. Additionally, the gate of transistor 22 is common with that of transistor 6 and the gate of transistor 24 is common with that of transistor 10.

Demonstration of the operation of the circuit in FIG. 3a shall be shown by example. Note that a capacitor exists comprising one plate formed by the gate of transistor 22 and a second plate which includes the body connection to node S2. Therefore, an energetic particle causing voltage change at node S2 due to an energetic particle generated charge at node S2 will initially result in approximately an equal amount of change at the gate of transistor 22. Likewise, the gate of transistor 24 responds in a similar way with regard to energetic particle- caused voltage changes at node S1 in the capacitor comprised of one plate formed by the gate of transistor 24 and a second plate which includes the body connection to node S1.

Assume that node S2 is at a higher voltage potential than node S1, and that memory cell 2 is storing a logic high corresponding to binary one. Transistors 6, 12, and 22 are on while transistors 8, 10, and 24 are off. However, transistor 24 is able to provide a feedback path between inverters 4 and 5 through a gated diode provided by the structure of transistor 24 which will be explained further in this description. When the body of transistor 8 is hit by a critical- charge- generating energetic particle, such as a heavy ion, node S2 begins to drop in voltage. Through capacitive coupling, this lowers the voltage at node S3. Thus, in response to this lower voltage at node S3, transistor 6 turns o more strongly, raising the voltage at node S2 and allowing cell 2 to maintain its logic state. Should a charge -generating energetic particle hit the body of transistor 10, node S1 rises in voltage. However, this causes the voltage at node S4 to rise and causes transistor 12 to turn on stronger, thereby allowing cell 2 to recover from the hit. Likewise, assuming cell 2 is storing a zero with node S1 higher in voltage than node S2, (transistors 8, 10, and 24 on with transistors 6, 12 and 22 off) if an energetic particle hits the body of transistor 12, node S1 begins to drop in voltage. This lowers the voltage at node S4 of the capacitor formed by the gate of transistor 22 and the source/drain at node SI of transistor 24. In response to the lowered voltage at node S4, transistor 10 turns on more strongly and raises the voltage at node S1, thus maintaining cell 2's logic state. As with transistor 24, transistor 22 is able to provide a feedback path between inverters 4 and 5 due to gated diode structure provided by the structure of transistor 22 which will be discussed further in this description. If the body of transistor 6 is hit by a charge generating particle, node S2 rises in voltage. However, this raises the voltage at node S3. Therefore transistor 8 turns on more and allows charge to drain off node S2 thereby allowing memory cell 2 to recover from the hit.

Transistors 22 and 24 provide additional RC time constant delay which will further enable memory cell 2 to recover from a charge- generating energetic particle hit before the feedback mechanism latches the cell in the flipped state.

Figure 3B:
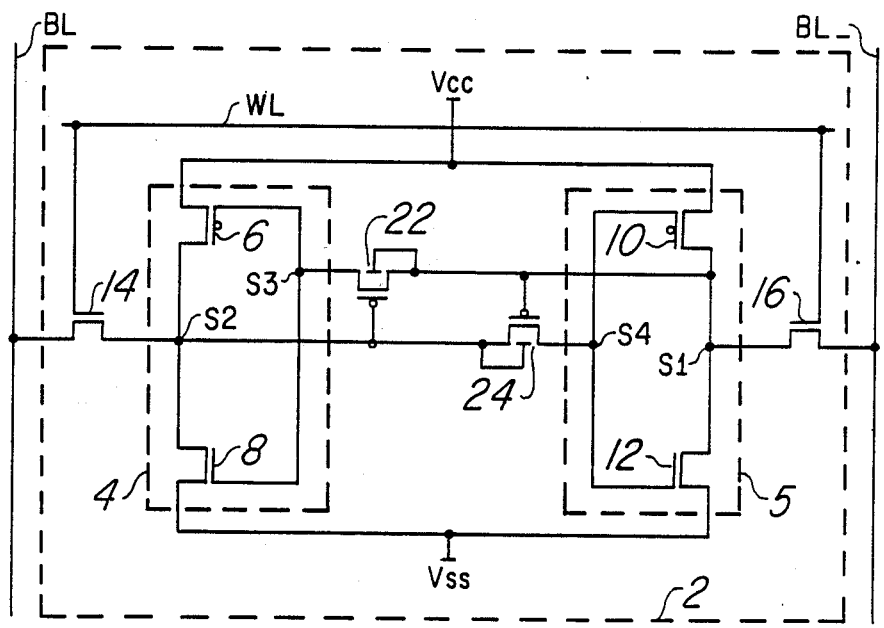
FIG. 3b illustrates a schematic drawing of a second embodiment of the invention.

FIG. 3b illustrates a schematic drawing of a second embodiment of the invention. This circuit is the same as that shown in FIG. 3a with the following exceptions: one drain/source of transistor 22 is connected to the common gate of inverter 4 while its other drain/source is connected to the common drain of inverter 5; the gate of transistor 22 is connected to the common drain of inverter 4; one drain/source of transistor 24 is connected to the common gate of inverter 5 while its other drain/source is connected to the common drain of inverter 4; the body of transistor 22 is connected to node S1; the body of transistor 24 is connected to node S2; and the gate of transistor 24 is connected to the common drain of inverter 5.

Demonstration of the operation of the circuit shown in FIG. 3b will be done by way of example. Assume that node S2 is at a higher voltage potential than node S1, and that memory cell 2 is storing a logic high corresponding to binary one. Transistors 8, and 22 are off and transistor 6 is on. When the body of transistor 8 is hit by an energetic particle, such as a heavy ion, node S2 begins to drop in voltage. Capacitive coupling lowers the voltage at node S3. Therefore transistor 6 turns on more strongly. Thus, node S2 rises in voltage, allowing memory cell 2 to recover from the hit. If the body of transistor 10 is hit by a charge generating energetic particle, node S1 rises in voltage. This correspondingly causes a rise in voltage at node S4 which turns transistor 12 on stronger. Thus, cell 2 is able to recover from the hit. Likewise, assuming cell 2 is storing a logic low with S1 higher in voltage than S2, (transistors 8, 10 and 22 on with transistors 6, 12, and 24 off) if a critical charge generating energetic particle hits the body of transistor 12, node S1 begins to drop in voltage. If node S1 drops in voltage low enough, transistor 24 turns on, causing transistor 10 to turn on stronger. Thus the voltage at node S1 is raised and cell 2 is able to recover. Should the body of transistor 6 get hit by a charge generating energetic particle, node S2 rises in voltage causing node S3 to correspondingly rise i voltage. This causes transistor 8 to turn on stronger and drain the added charge off of node S2. Hence, cell 2 recovers from the hit.

As with the circuit in FIG. 3a, transistor 22 and 24 provide additional RC delay and feedback paths discussed previously in connection with FIG. 3a.

Note that the circuits shown in FIGS. 3a and 3b both offer reduced SEU without substantial slowing of the memory write cycle. Additionally, a relatively high capacitance exists for SEU protection whether the channel is inverted or accumulated in transistors 22 or 24 of FIGS. 3a and 3b.

Figure 4A:
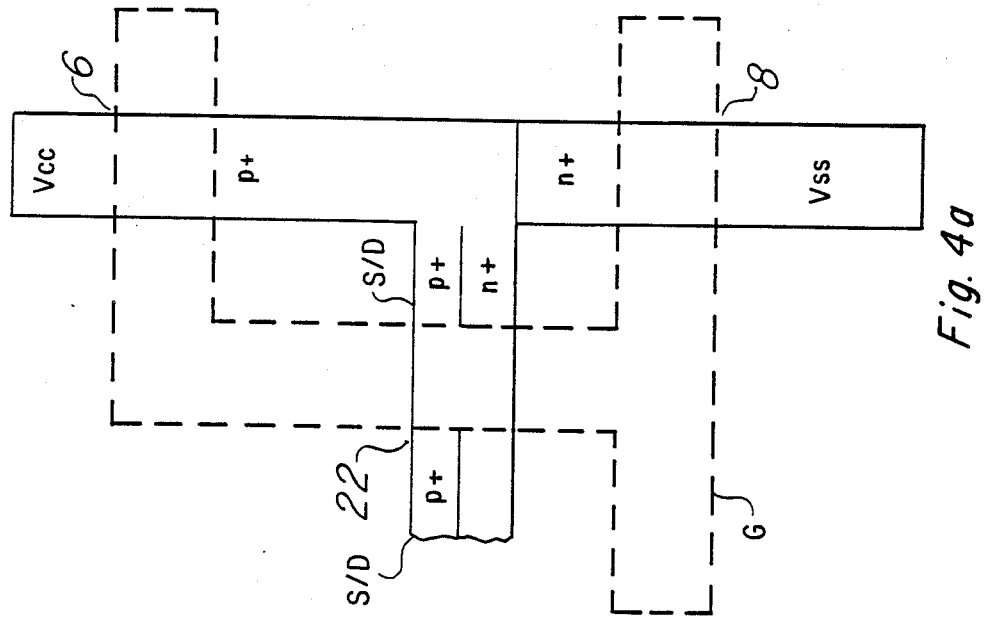
FIG. 4a illustrates a top view of the gated diode structure.
Figure 4B:
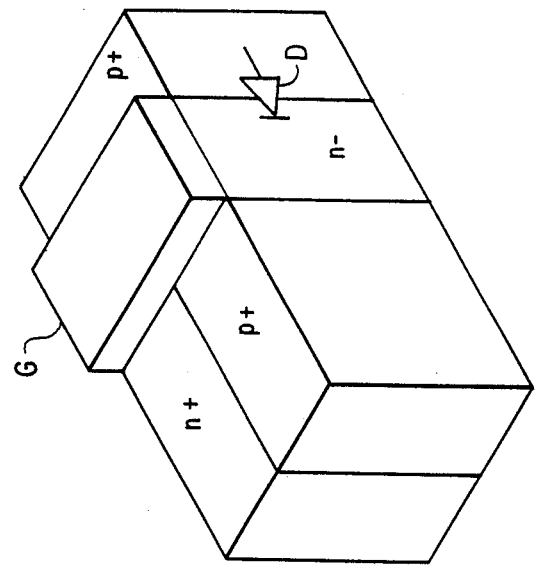
FIG. 4b illustrates a cross-sectional view of silicided adjacent heavily doped n-type and p-type regions.

The gated diode structure of transistor 22 is illustrated in FIG. 4a which illustrates a top view of this structure. Gate G (shown in dotted lines) of transistor 22 is formed of polysilicon (or metal) and is common to the gates of transistors 6 and 8. P+ type and n+ type semiconductor regions ar marked p+ and n+ respectively. The source of transistor 6 is labeled Vcc while the source of transistor 8 is labeled Vss so that both sources indicate their respective voltage potentials. Transistor 22's source/drain regions are labeled S/D. When transistor 22 is on (gate voltage low), it functions as a typical field effect transistor. However, when transistor 22 is off (gate voltage high) it functions as a gated diode so as to maintain voltages in the cross-coupled inverter structure of a memory cell. Thus, a path for feedback primarily from p+ semiconductor region p+ under gate G to n+ semiconductor region n+ is provided by the diode function. In order to form a common node (such as node S2 shown in FIG. 3a), the adjacent n+ and p+ regions are connected by silicide. With respect to FIG. 3a transistor 24's structure is similar to transistor 22 and can be visualized by relabeling transistor 6 as 10, transistor 22 as 24 and transistor 8 as 12. FIG. 4b is a cross-sectional view of transistors 22 and 24 illustrating heavily doped n− type regions n+ (large concentration of donors) which will be silicided with abutting heavily doped P+ regions P+ (large concentration of acceptors). Also known are body region n− and source/drain region. labeled p+. A p-n diode D is formed as comprising source /drain region p+ and moat region n. Thus, when the cathode of diode D is at a sufficiently low voltage, current passes from region p+ to the adjacent silicided region of n+ and p+. Thus, for example, with reference to FIG. 3a, a logic low voltage at node S2 brings node S4 low even though node S3 is high.

Note than the body contact B (referring to the substrate portion of the transistor outside of the gate, source and drain) shown in FIGS. 3a and 3b could have been placed on the opposite source/drain regions of transistors 22 and 24. Although this variation gives an extra capacitance benefit, the diode action does not maintain the cross-coupling path when transistors 22 or 24 are off.

Figure 5:
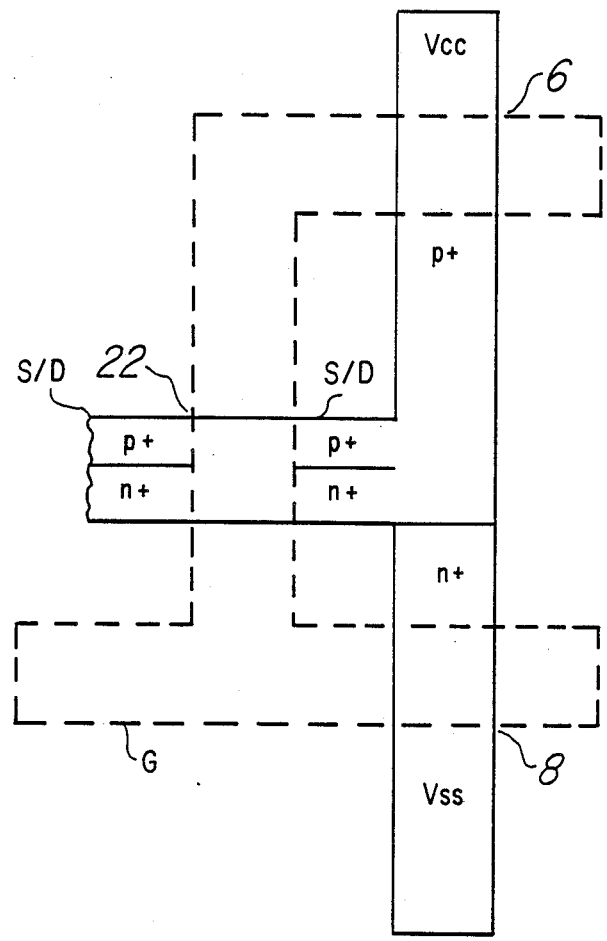
FIG. 5 illustrates a top view of a third embodiment of the invention.

A third embodiment of the invention which increases memory cell speed with a little less SEU protection than the embodiment of FIG. 4a is shown in FIG. 5. This figure is the same as FIG. 4a with the exception that adjacent n+ and p+ regions are added to both source/drain regions of transistor 22. Likewise, an adjacent n+ and p+ region may be added to both source drain regions of transistor 24 of FIGS. 3a and 3b.

Figure 6:
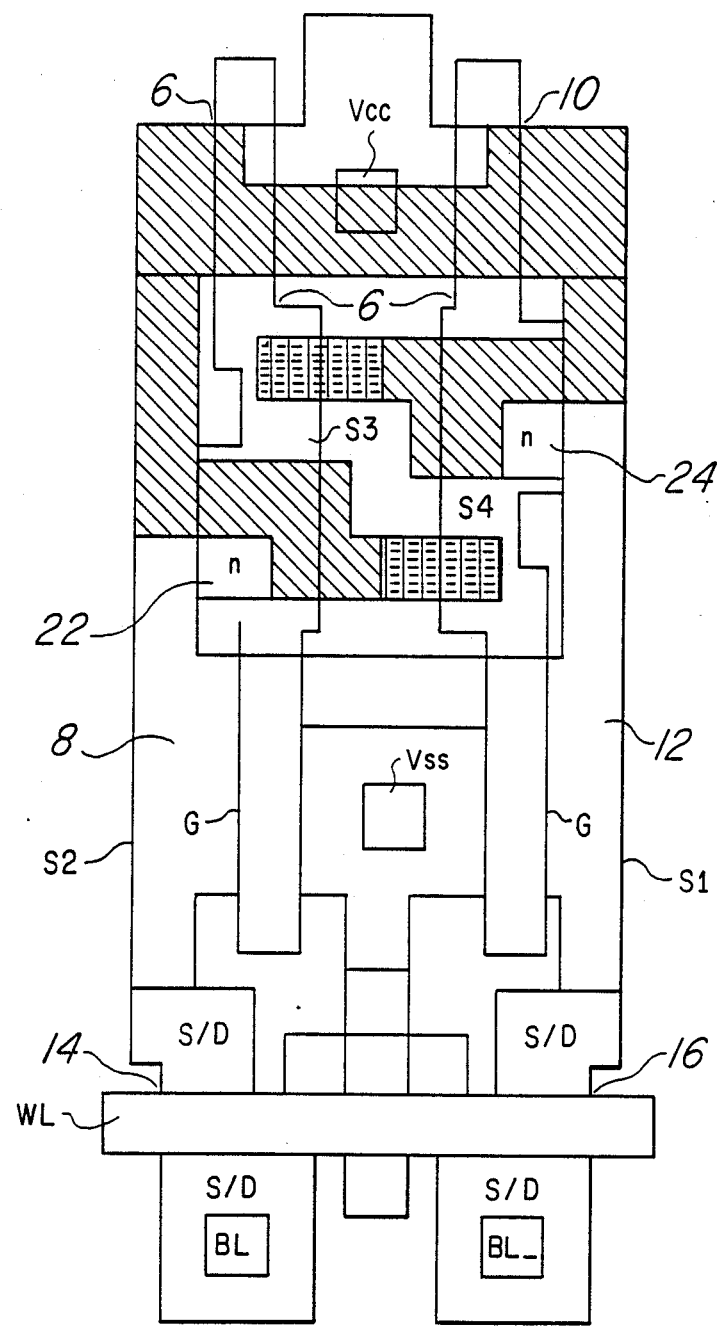
FIG. 6 illustrates the superposition of a plurality of photo lithographic masks showing the physical layout of the memory cell.

The layout FIG. 6 illustrates th superposition of a plurality of portions of photo lithographic masks so as to show an example of the physical layout of memory cell 2 and elements associated therewith. FIG. 6 therefore shows these mask portions as they relate to what is shown in FIG. 3a. Positions for bit lines BL and BL−are adjacent to one of two source/drain regions labeled S/D of transistors 14 and 16 respectively. The position of a common gate to transistors 14 and 16 is shown labeled word line WL. Other selected gate positions are labeled . The positions of transistors 8 and 10 are indicated around the contact area labeled Vss (corresponding to the voltage Vss in FIG. 3a for this position) while the positions of transistor 6 and 10 are indicated around contact area Vcc (corresponding to the voltage Vcc in FIG. 3a for this position). P-type semiconductor areas are indicated by diagonal lines. The positions of transistors 22 and 24 are shown with each including the position of its p-type region and adjacent n-type region labeled n. The checkered areas show the positions of areas connected by local interconnect such as silicide to nodes S3 and S4. Transistors 22 and 24 can be enhancement p-channel transistors. Thus, no additional process or mask steps are required for their formation when making the memory cell and yet a high resistance is present in their channels. This aspect makes the memory cell even more hardened against SEU.

Figure 7D:
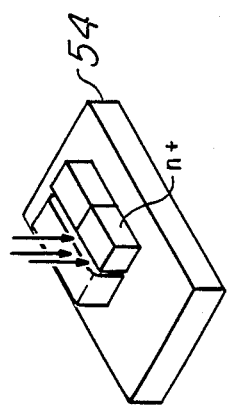
FIGS. 7a through 7e are cross-sectional views of the capacitor structure during various stages of formation.
Figure 7E:
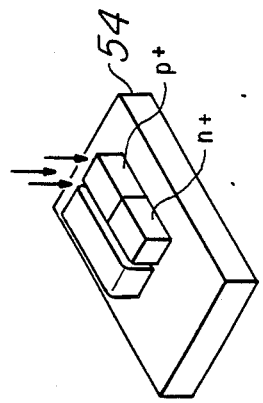
Figure 7A:
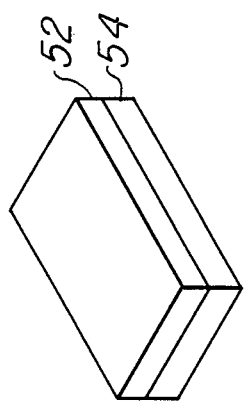
Figure 7B:
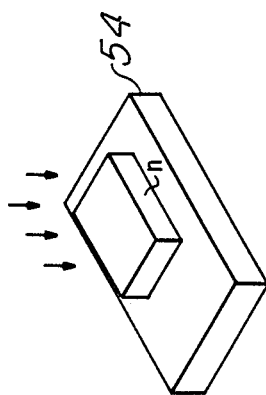
Figure 7C:
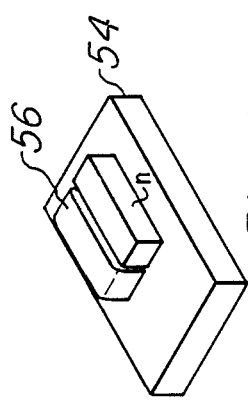

A brief overview of a possible fabrication process for making transistors 22 and 24, as they relate for example to that shown in FIG. 4a, omitting annealing steps and other sundry details which will be apparent, after reading the following description, to those skilled in the art, shall be described with reference to FIGS. 7a through 7e which show cross-sectional views of the transistor structure during various stages of formation. Starting with a silicon 52 on insulator 54 (i.e. silicon dioxide) structure as shown in FIG. 7a, a mesa is etched as shown in FIG. 7b. A light donor n− is now implanted (shown by arrows). Next an oxide layer 56 is grown. Polysilicon gate 58 is then deposited and patterned (along with oxide layer 56), followed by a heavy masked donor implant (see n+ region under implant indicating arrows) and then followed by a heavy masked acceptor implant adjacent the n+ region to form two source/drain regions (see p+ region under implant indicating arrows). Note that one of the source/drain regions is not shown. Titanium (not shown) is sputtered over the n+ and p+ adjacent regions and sintered in a nitrogen ambient to form titanium silicide connections (not shown) between the n+ and p+ regions to form a common node.

It is to be understood that in order to conserve space in the memory cell that the transistors in the cross-coupling of the foregoing embodiments are metal oxide semiconductor (MOS) transistors.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. For example, n-type semiconductor regions may be substituted consistently throughout with p-type semiconductor regions and vice versa. Additionally, n-channel transistors instead of p-channel transistors can be placed in the cross-coupling. It is contemplated that all such changes and additional embodiments are within the spirit and true scope of the invention as claimed below.

We claim:

1. A bi-stable logic state device comprising:
   a first and a second inverter;
   a first transistor and a first diode connected in parallel from the input of said first inverter to the output of said second inverter.

2. A bi-stable device as recited in claim 1 wherein said first diode is connected to said first and second inverters such that the anode of said first diode is connected to the input of said first inverter and the cathode of said first diode is connected to the output of said second inverter.

3. A bi-stable logic state device as recited in claim 1 wherein said first transistor includes a body region, said body region being connected to the output of said first inverter.

4. A bi-stable logic state device as recited in claim 1 wherein said device is formed on a thin film of semiconductor material overlying an insulator.

5. A bi-stable logic state device as recited in claim 1 which further includes:
   a second transistor and a second diode connected in parallel from the input of said second inverter to the output of said first inverter.

6. A bi-stable logic state device as recited in claim 5 wherein said second transistor includes a body region, said body region of said second transistor being connected to the output of said second inverter.

7. A bi-stable logic state device as recited in claim 5 wherein said first and second transistors are p-channel transistors.

8. A bi-stable logic state device as recited in claim 5 wherein said first and second transistors are metal oxide semiconductor transistors.

9. A bi-stable logic state device as recited in claim 5 wherein said first and second transistors are n-channel transistors.

10. A bi-stable logic state device as recited in claim 5 wherein a first source-drain n of said first transistor includes a structure comprising a n-type semiconductor region abutting a p-type semiconductor region.

11. A bi-stable logic state device as recited in claim 10 wherein said n-type and p-type abutting regions are connected with a conductive material.

12. A bi-stable logic state device as recited in claim 5 wherein a second source/drain of said second transistor includes a structure comprising a n-type semiconductor region abutting a p-type semiconductor region.

13. A bi-stable logic state device as recited in claim 12 wherein said n-type and p-type abutting regions of said second source/drain are connected with a conductive material. drain are connected with a conductive material.

* * * * *